(12) United States Patent
Cheung et al.

(10) Patent No.: US 8,967,452 B2
(45) Date of Patent: Mar. 3, 2015

(54) THERMAL COMPRESSION BONDING OF SEMICONDUCTOR CHIPS

(75) Inventors: Yiu Ming Cheung, Kowloon (HK); Tsan Yin Peter Lo, Kwai Chung (HK); Ming Li, Kwai Chung (HK); Yick Hong Mak, Hong Kong (HK); Ka San Lam, Kowloon (HK)

(73) Assignee: ASM Technology Singapore Pte Ltd, Singapore (SG)

( * ) Notice: Subject to any disclaimer, the term of this patent is extended or adjusted under 35 U.S.C. 154(b) by 513 days.

(21) Appl. No.: 13/448,866

(22) Filed: Apr. 17, 2012

(65) Prior Publication Data

US 2013/0270230 A1    Oct. 17, 2013

(51) Int. Cl.
*B23K 31/02*    (2006.01)
*B23K 26/20*    (2014.01)

(52) U.S. Cl.
USPC .. 228/180.21; 228/228; 228/230; 219/121.66

(58) Field of Classification Search
None
See application file for complete search history.

(56) References Cited

U.S. PATENT DOCUMENTS

| | | | |
|---|---|---|---|
| 5,341,979 A * | 8/1994 | Gupta | 228/111 |
| 5,439,161 A * | 8/1995 | Kawatani et al. | 228/180.21 |
| 5,481,082 A * | 1/1996 | Yamamoto | 219/121.63 |
| 5,495,089 A * | 2/1996 | Freedman et al. | 219/121.64 |
| 5,904,868 A * | 5/1999 | Economikos et al. | 219/121.63 |
| 6,142,356 A * | 11/2000 | Yamazaki et al. | 228/6.2 |
| 6,336,990 B1 * | 1/2002 | Tanaka et al. | 156/306.9 |
| 6,593,545 B1 * | 7/2003 | Greenwood et al. | 219/121.85 |
| 8,016,181 B2 * | 9/2011 | Saimen | 228/179.1 |
| 2002/0140094 A1 * | 10/2002 | Kubota et al. | 257/737 |
| 2004/0056068 A1 * | 3/2004 | Rae et al. | 228/102 |
| 2004/0065647 A1 * | 4/2004 | Kubo et al. | 219/121.61 |
| 2004/0152238 A1 * | 8/2004 | Maeda et al. | 438/108 |
| 2004/0217100 A1 * | 11/2004 | Ogimoto et al. | 219/243 |
| 2009/0155958 A1 * | 6/2009 | Kolodin et al. | 438/120 |
| 2010/0006624 A1 * | 1/2010 | Nakatsuka et al. | 228/102 |
| 2013/0330879 A1 * | 12/2013 | Maki et al. | 438/107 |

FOREIGN PATENT DOCUMENTS

| | | |
|---|---|---|
| EP | 0949670 A2 * | 10/1999 |
| JP | 02-027792 A * | 1/1990 |
| JP | 05-329931 A * | 12/1993 |

* cited by examiner

*Primary Examiner* — Kiley Stoner
(74) *Attorney, Agent, or Firm* — Ostrolenk Faber LLP (57) ABSTRACT

A die is prepared for thermal compression bonding by first aligning electrical contacts on the die to bond pads on a substrate onto which the die is to be mounted. Those electrical contacts are held against the bond pads on the substrate with a bonding tool. Partially bonding the die onto the substrate by providing heat to a portion of the die to elevate a temperature there to above a melting point of solder in the electrical contacts so as to melt at least some of the solder. Then thermally compress the whole die and heat it to above the melting point of the solder of the electrical contacts so that the solder of the electrical contacts outside the portion of the die are also melted to bond the die to the substrate.

20 Claims, 6 Drawing Sheets

THERMAL COMPRESSION BONDING OF SEMICONDUCTOR CHIPS

FIELD OF THE INVENTION

The invention relates to the attachment of semiconductor chips onto substrates, particularly by way of solder interconnects.

BACKGROUND AND PRIOR ART

Solder reflow during the assembly of flip-chip packages is widely adopted in the electronic packaging industry. The interconnects of flip-chip silicon dies are commonly made of solder balls or bumps in area-array arrangement. The die is aligned and accurately placed onto a substrate such as a printed wiring board ("PWB") so that the solder balls land on the solder pads of the substrate, from where the interconnects of the die are connected to the electrical circuit of the substrate. The solder pads comprise copper trace circuitry (with thickness of about 18 µm) coated with nickel (with thickness of about 6 µm) and gold (with thickness of less than 0.1 µm). An appropriate amount of solder flux will be applied to the soldering surfaces prior to the die placement process. Application of solder flux can promote wetting between the solder balls and the solder pads of the substrate during the reflow process. A reflow oven provides a well-controlled heating and cooling profile in order to ensure reliable solder-joint formation during reflow and solidification of the solder joint. The self-alignment characteristics of solder reflow allows a less accurate and faster pick-and-place machine to be used in the assembly process.

The above batch assembly process has proven to be productive and is widely adopted in the manufacturing of various flip-chip packages. The solder reflow process is applicable if the pitches of the solder balls are large enough, say more than 150-200 µm. At these ball pitches, a fairly accurate but high throughput flip-chip bonder can be used to realize the pick-and-place process since the self-alignment characteristics of solder reflow can help correct any die placement errors. However, when the pitches of the interconnects are further reduced to less than 150 µm, bridging failure of solder joints during the reflow process may occur.

Figure 1:
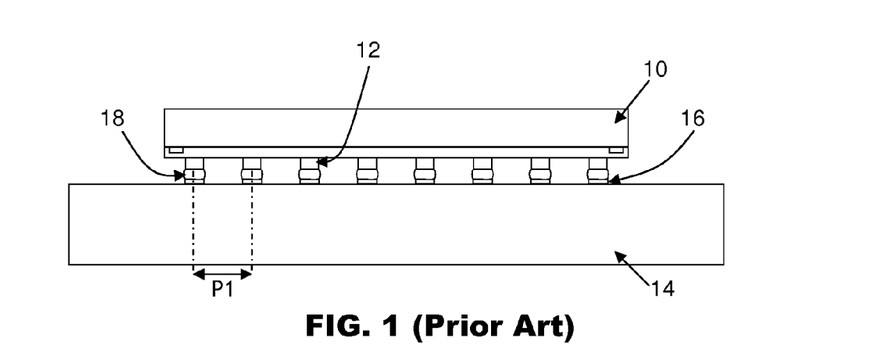
FIG. 1 is a side view of a flip-chip die with solder-capped copper pillar interconnects bonded onto a substrate.

FIG. 1 is a side view of a flip-chip die 10 with solder-capped copper pillar 12 interconnects bonded onto a substrate 14. The electrical interconnects of the flip-chip die 10 are redistributed by its redistribution layer. The interconnects are redistributed to an area array of copper pillars 12 having pitch P1 which are matched with that of the pad pitch of the solder pads 16 on the high density interconnect substrate 14. An interconnect on the flip-chip die 10 comprises the copper pillar 12 with a solder cap 18 at its tip. The tin-based solder (Sn, SnAg, SnAgCu) of the solder cap 18 melts and wets the solder pad 16 of the substrate 14 to the solder joints during the soldering process. The bump pitch P1 for state of-the-art fine-pitch flip-chip bonding on substrates (which can be made from BT resin or other laminated materials) is about 120-150 µm.

Figure 2:
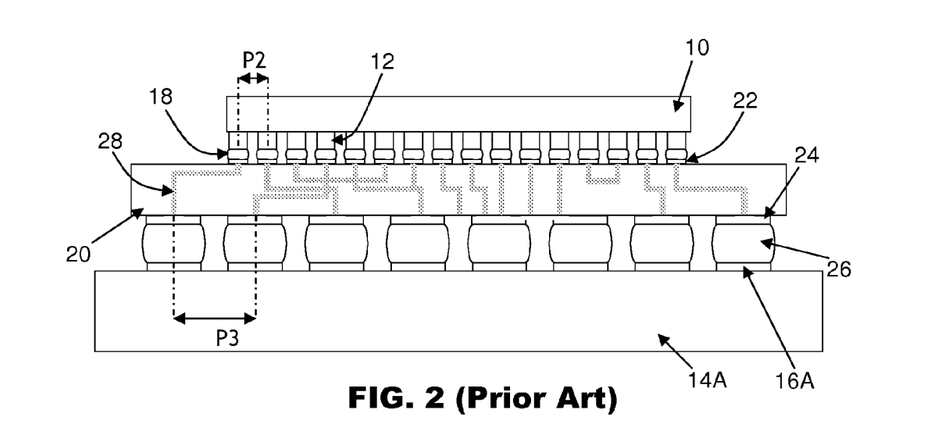
FIG. 2 is a side view of the flip-chip die with solder-capped copper pillar interconnects bonded onto a substrate with a redistribution interposer.

If the fine-pitch flip-chip die 10 is bonded onto redistribution interposers 20 (which may be made from silicon, glass or ceramics), the pad pitch P2 can be as low as 40-60 µm, as shown in FIG. 2, which is a side view of the fine-pitch flip-chip die 10 with solder-capped copper pillar 12 interconnects bonded onto a substrate 14A with a redistribution interposer 20. The redistribution interposer 20 containing electrical routings and through-vias 28 redistributes the fine-pitch P2 interconnects of solder caps 18 to a much larger pitch P3 (more than 200 µm) for the area array of the solder balls 26 on the substrate 14A. Therefore, the pad pitch P2 of solder pads 22 of the redistribution interposer 20 facing the fine-pitch flip-chip die 10 can be as small as 40-60 µm but the pad pitch P3 of solder pads 24 on the bottom side of the redistribution interposer 20 is greater than 200 µm, which matches the pad pitch of the solder pads 16A on the substrate 14A.

One way to reduce the chance of bridging of the solder balls 26 is to reduce the solder volume by using solder-capped copper pillars 12 to replace the solder balls 26 as the interconnects as shown in FIGS. 1 and 2. The dimensions of the copper pillar 12 (height and width) and the thickness of the solder cap 18 play important roles in the design of reliable joints. Even though this design can reduce solder bridging failure for fine-pitch flip-chip packages, it introduces new problems for the manufacturing process. Firstly, the self-alignment process of the solder joints during reflow processes may not be able to take place as solder volume is much reduced. Hence, a more precise flip-chip pick-and-place machine is needed for the assembly process. Secondly, the volume control of these solder-capped solder will be very critical. In order to ensure all the solder caps 18 are in full contact with the solder pads 16 on the substrate 14 when solder joints are formed, a sufficiently high compressive force should be applied on the flip-chip die 10 at the initial stage of the bonding cycle. A thermal compression (TC) bonding process instead of a solder reflow process has to be used for bonding the fine-pitch flip-chip die 10 with solder-capped copper pillar 12 interconnects onto the substrate 14 with fine-pitch solder pads 16.

The process flow of the conventional thermal compression (TC) process for fine-pitch flip-chip dies 10 with solder-capped copper pillar 12 interconnects consists of two major assembly processes, namely, a precise alignment process followed by thermal compression bonding. In a conventional setup, these two processes have to be performed consecutively one after the other since any disturbance may displace the flip-chip die 10 from its accurate alignment with the fine-pitch solder pads 16 on the substrate 14 or solder pads 22 on the redistribution interposer 20. The process starts with transporting a substrate 14 onto an input position of a bonding station which is maintained at a pre-heated temperature T1 below the melting temperature Tm of solder. A bonding tool picks up a fine-pitch flip-chip die 10 from the wafer table. The precision alignment of the fine-pitch flip-chip die 10 is done with the help of up-looking and down-looking vision alignment systems. The fine-pitch flip-chip die 10 will be positioned in such a way that its solder caps 18 will be aligned in accordance with the position and orientation of the solder pads 16 on the substrate 14 or the solder pads 22 on the redistribution interposer 20. At the end of the alignment process, the flip-chip die 10 is held by the bonding tool to keep its alignment position and then placed onto the substrate 14 (or the redistribution interposer 20) with the application of an appropriate compressive force F1 which ensures the good contact of the solder caps 18 and solder pads 16, 22.

The process time t1 for the precision alignment process is in the order of a few seconds (2-3 seconds) for alignment accuracy of up to +/−1 µm. At the beginning of the thermal compression bonding process, the flip-chip die 10 held by the bonding tool is elevated to temperature T2 which exceeds the melting temperature Tm of the solder on the copper pillars 12. This can be achieved by using a pulsed heater installed on the bonding tool. When the solder on the copper pillars 12 reaches its melting temperature Tm, the compressive force acting on the flip-chip die 10 will be reduced to force F2 to prevent the collapsing of the solder joints during reflow. The solder on the tip of the copper pillar 12 then wets the solder pads 16 of the substrate 14 (or the solder pads 22 of the redistribution interposer 20). The bonding tool starts cooling and its temperature drops below temperature Ts at which the solder will be solidified. Solder joints will form between the copper pillars 12 of the flip-chip die 10 and the solder pads 16 of the substrate 14 (or the solder pads 22 of the redistribution interposer 20). At the end of this thermal compression bonding cycle, the bonded flip-chip die 10 on the substrate 14 (or on the redistribution interposer 20) will be transported to an output station of the bonder. The process time t2 for this thermal compression bonding cycle is in the order of 3 to 8 seconds, which in practice depends on how fast the bonding tool can be heated up and cooled down.

One major disadvantage of the conventional thermal compression bonding process is its low overall throughput. The pick-and-place machine should be able to align the flip-chip die 10 precisely in accordance with the locations of pad openings for the solder joints on the substrate 14. The alignment accuracy requirement for this process has to be better than +/−2 μm at 6-sigma. A state-of-the-art thermal compression bonder can achieve +/−1 μm alignment accuracy within a few seconds (2-3 seconds). After this accurate alignment, the bonding tool holding the flip-chip die 10 is then heated up and cooled down by a pulse heater according to a pre-determined temperature profile during which the solder at the tip of the copper pillars 12 melt and then solidify to form solder joints on the solder pads of the substrate. The compressive force acting on the flip-chip 10 has to be controlled in such a way that a desired stand-off height of the solder joint can be maintained. Since heating and cooling of the bonding tool takes time, this thermal compression bonding cycle takes at least 3 to 8 seconds. Hence, the cycle time for the overall alignment and bonding process is around 5 to 10 seconds and the throughput of the process is around 500 units per hour. The throughput of this process has to be increased in order for it to gain popularity for volume production.

SUMMARY OF THE INVENTION

It is thus an object of the invention to seek to provide a bonding apparatus which increases the throughput of a thermal compression bonding process for semiconductor devices as compared to that practised in the prior art.

According to a first aspect of the invention, there is provided a thermal compression bonding method comprising the steps of: aligning electrical contacts on a die to bond pads on a substrate onto which the die is to be mounted; after aligning the die, holding the electrical contacts on the die against the bond pads on the substrate with a bonding tool; partially bonding the die to the substrate by providing heat to a portion of the die to elevate a temperature at the portion of the die to above a melting point of solder comprised in the electrical contacts so as to melt at least some of the solder of the electrical contacts which are located at the said portion of the die; and thereafter heating the whole die to above the melting point of solder of the electrical contacts so that the solder of the electrical contacts outside the said portion of the die are also melted to bond the die to the substrate.

According to a second aspect of the invention, there is provided a thermal compression apparatus comprising: a precision alignment station for aligning a die comprising electrical contacts to bond pads on a substrate onto which the die is to be mounted; a bonding tool for holding the electrical contacts on the die against the bond pads on the substrate; a heating device operative to partially bond the die to the substrate by providing heat to a portion of the die to elevate a temperature at the portion of the die to above a melting point of solder comprised in the electrical contacts so as to melt at least some of the solder of the electrical contacts which are located at the said portion of the die; and a thermal compression station for heating the whole die to above the melting point of the solder of the electrical contacts so that the solder of the electrical contacts outside the said portion of the die are also melted to bond the die to the substrate.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which.

DETAILED DESCRIPTION OF THE PREFERRED EMBODIMENTS OF THE INVENTION

Figure 3:
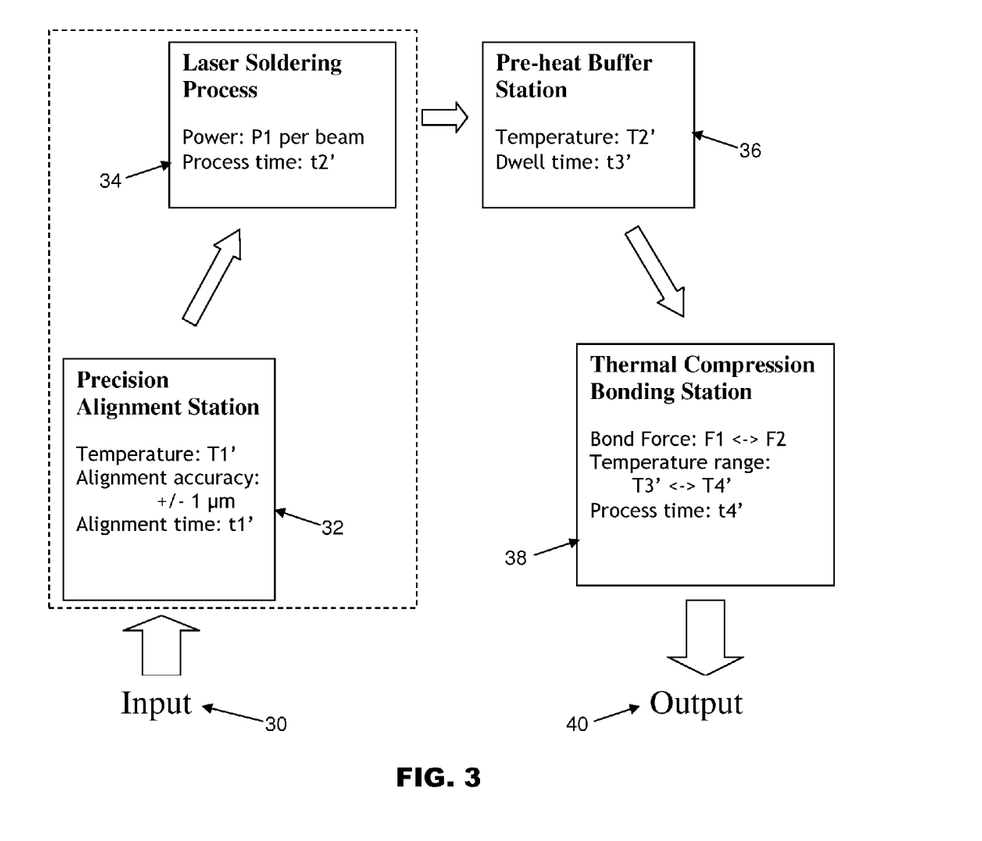
FIG. 3 is an overview of the bonding process according to the preferred embodiment of the present invention.

FIG. 3 is an overview of the bonding process according to the preferred embodiment of the present invention. The process enables parallel processing of the two major assembly processes, namely the precision alignment process and thermal compression bonding. The thermal compression bonder comprises the precision alignment station 32, the thermal compression bonding station 38 and a buffer station 36. The buffer station 36 is used as buffer for balancing the process flow as well as pre-heating the partially-bonded unit.

At the precision alignment station 32, both the precision alignment process and the laser soldering process 34 are carried out. All these process stations may reside in different parts of the thermal compression bonder, and a robotic arm may be used to transport the processing flip-chip from one processing station to another. The material flow of the system is described below.

The substrate 14 is loaded from an input port 30 by an input loader and the flip-chip die 10 is picked from a wafer table. They are placed on the precision alignment station 32 for the active alignment and laser soldering 34. The aligned flip-chip die 10 is partially bonded onto the substrate 14 by laser soldering 34 and then transferred to the buffer station 36 for pre-heating. After the partially-bonded flip-chip die 10 is transferred to the buffer station 36, the precision alignment station 32 can work on the next unit immediately. Once the bonded flip-chip die 10 in the buffer station 36 reaches the desirable pre-heat temperature and the thermal compression bonding station 38 is available, the bonded flip-chip die 10 is transferred to the thermal compression bonding station 38 to perform thermal compression bonding. At the end of the thermal compression bonding process, the fully-bonded flip-chip die 10 is transported to an output port 40 of the thermal compression bonder.

The laser soldering 34 thus forms a partial bond to secure the aligned flip-chip die 10 in position on the substrate 14, allowing the precision alignment and thermal compression bonding processes to be carried out in parallel on different units at separate process stations instead of sequentially on the same unit at the same station.

Figure 4:
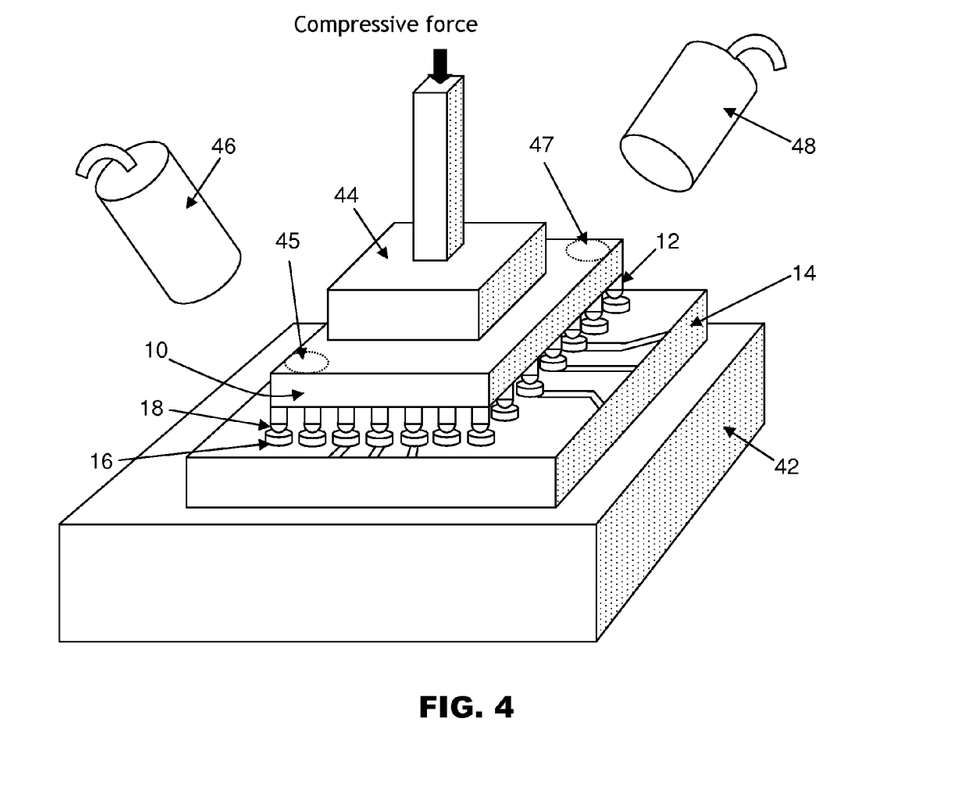
FIG. 4 is an isometric view of a bonding apparatus according to the preferred embodiment of the present invention for bonding a semiconductor chip.

FIG. 4 is an isometric view of a bonding apparatus according to the preferred embodiment of the present invention for bonding a flip-chip die 10. A bonding tool 44 is operative to hold the flip-chip die 10 and to press the copper pillars 12 and solder caps 18 against the solder pads 16 of the substrate 14. The substrate 14 is supported by and secured to a platform 42 during bonding. A pair of laser heads 46, 48 is located at opposite diagonal corners of the flip-chip die 10. The laser heads 46, 48 are connected to optical fiber cables, a fiber collimator and focusing optics. Laser beams from the optical fiber cables are collimated and then preferably focused to laser spots 45, 47 having diameters of about 1 mm at two diagonally-opposite corners of the back-side of the flip-chip die 10.

The laser heads 46, 48 are operative to project laser beams at the corners of the flip-chip die 10 for heating the flip-chip die 10 and promoting partial bonding of the flip-chip 10 to the substrate 14, which will be further explained below.

Figure 5:
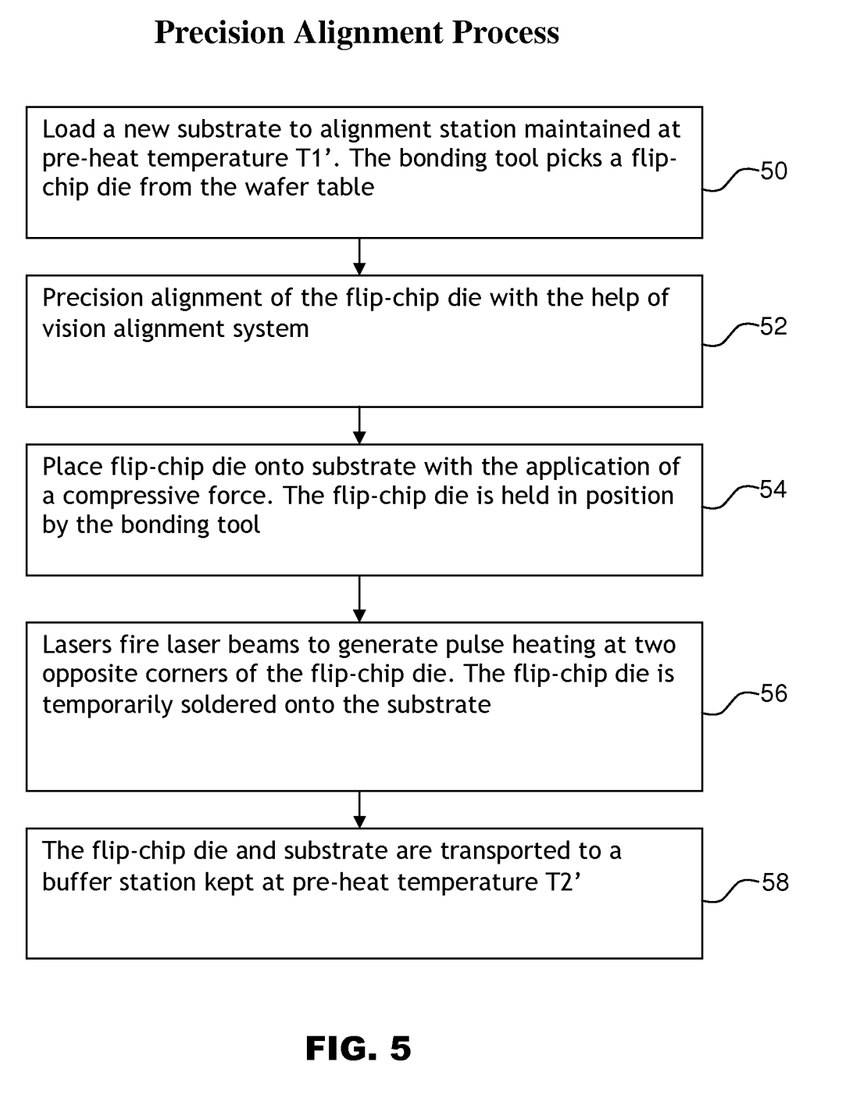
FIG. 5 illustrates a precision alignment process flow according to the preferred embodiment of the present invention.

The detailed operation at the different processing stations is now described. FIG. 5 illustrates a precision alignment process flow according to the preferred embodiment of the present invention. A substrate 14 is loaded to the precision alignment station 32 from the input port 30 and is placed onto the alignment pre-heat platform 42 on top of the vacuum table of the precision alignment station 32. A flip-chip die 10 is held by the bonding tool 44 and is picked from the wafer table of the bonder. The alignment pre-heat platform 42 of the precision alignment station is maintained at temperature T1', which pre-heats the substrate 14 to a temperature that is higher than room temperature using a pre-heating process 50. In order to ensure a good image quality for vision alignment system as well as minimal thermal mechanical deformation of the alignment mechanism, the pre-heat temperature T1' of the precision alignment station is set to a temperature below 100° C. At this temperature, the impact of hot air currents on the imaging optics of the vision alignment system is minimized. The additional temperature required for a subsequent laser soldering process can also be reduced.

The flip-chip die 10 is held by the bonding tool 44 so that its electrical contacts in the form of copper pillars 12 and solder caps 18 are accurately aligned to the solder bond pads 16 on the substrate 14 at the precision alignment station 32, which is facilitated by an automatic vision alignment mechanism in a precision alignment process 52. The alignment accuracy for the precision alignment of the flip-chip die 10 with solder-capped copper pillars 12 is in the order of +/−1 µm. It takes an alignment time of t1' to achieve this alignment accuracy with the help of a precisely controlled bonding tool 44 holding the flip-chip die 10 as well as calibrated vision alignment optics and cameras. The bonding tool 44 then places the flip-chip die 10 against the substrate 14 with the solder-capped copper pillars 12 aligned to the bond pads 16 with the application of appropriate compressive force F1 in a placement process 54. The bonding tool 44 then holds the flip-chip die 10 in position.

Once the precision alignment is completed, the flip-chip die 10 held by the bonding tool 44 is then laser soldered temporarily on the substrate 14 by two laser beams from the laser heads 46, 48 having power P1 each for process time t2' in a temporary laser bonding process 56. The laser beams conduct laser soldering at a portion of the flip-chip die 10 to form temporary bonds for the flip-chip die 10 on the substrate 14, wherein one laser beam points at one corner of the flip-chip die 10 and the other laser beam points at a diagonally-opposite corner of the flip-chip die 10. An appropriate compressive force is applied to the flip-chip die 10 by the bonding tool 44 when the laser beams are being fired.

Most semiconductor flip-chips 10 are made of silicon. The wavelength of the laser beam is therefore selected in the range of 700-980 nm at which the absorption of the laser beam by the silicon is high. The silicon flip-chip die 10 can absorb almost all the laser power. Heating zones are then generated around the laser spots 45, 47 at the corners of the flip-chip die 10 where the laser beams are aiming at. The heat is conducted through the body of the flip-chip die 10 to the copper pillars 12 and the solder caps 18. The compressive force acting on the flip-chip 10 ensures that the solder caps 18 have good contact with the solder pads 16 of the substrate 14. The substrate 14 is pre-heated to temperature T1' while it is on the pre-heat platform 42. The power P1 of the laser beam is optimized to heat up the heat-affected zone at the corner of the flip-chip 10 to a temperature higher than the solder melting temperature Tm for within a process time of t2' which is less than a second. At least some of the solder-capped copper pillars 12 at the heated portion of the flip-chip die 10 at the laser spots 45, 47 are melted onto the bond pads 16. The partially-bonded flip-chip die 10 and substrate 14 are then transported to a pre-heat buffer station 36 which is kept at a pre-heat temperature T2' in a buffer pre-heating process 58.

Figure 6:
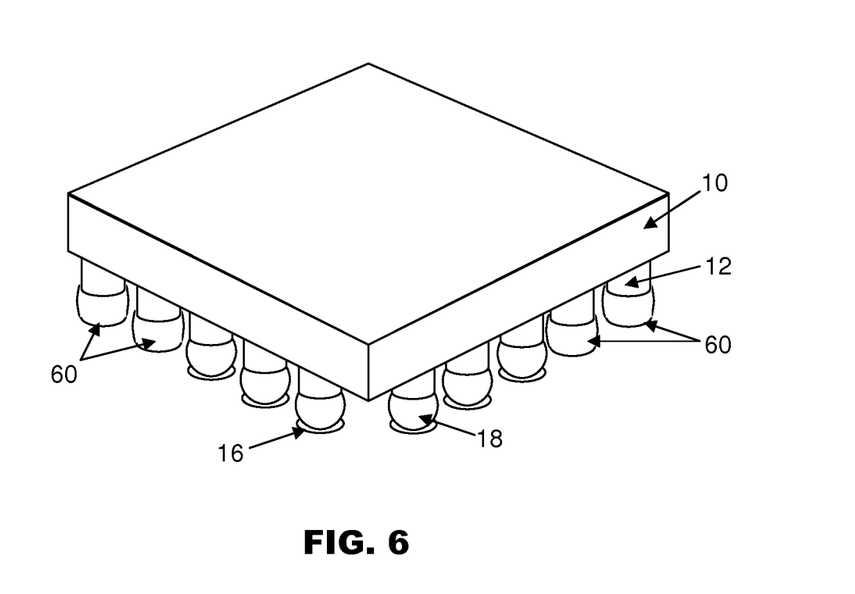
FIG. 6 is an isometric view of a flip-chip which has been partially bonded onto the substrate.

FIG. 6 is an isometric view of a flip-chip die 10 which has been partially bonded onto the substrate 14. Underneath the laser heating zones, solder joints 60 are formed when the solder caps 18 of the copper pillars 12 within the laser heating zones melt and wet the corresponding solder pads 16 of the substrate 14. A solder mask around the solder pads 16 prevents the bridging of melted solder on the solder pads 16. When the laser pulses are switched off, the heat generated by the laser source is rapidly conducted out of the laser heating zones. The temperatures at these regions drop rapidly below the solder solidification temperature Ts and hence bonded solder joints 60 are formed. For those solder caps 18 outside the laser heating zone, the solder caps 18 remain unbonded to the solder pads 16. As shown in FIG. 6, solder joints 60 formed due to melting of the solder caps 18 are found only at two corners of the flip-chip die 10.

At the pre-heat buffer station 36, the partially-bonded flip-chip die 10 is heated to pre-heat temperature T2' for dwell time t3'. The pre-heat temperature T2' at the buffer station 36 is higher than the pre-heat temperature T1' at the precision alignment station 32 but is lower than the solder melting temperature Tm. When the thermal compression bonding station 38 is available, the partially bonded flip-chip die 10 at temperature T2' is transported to the thermal compression bonding station 38 for final bonding.

Figure 7:
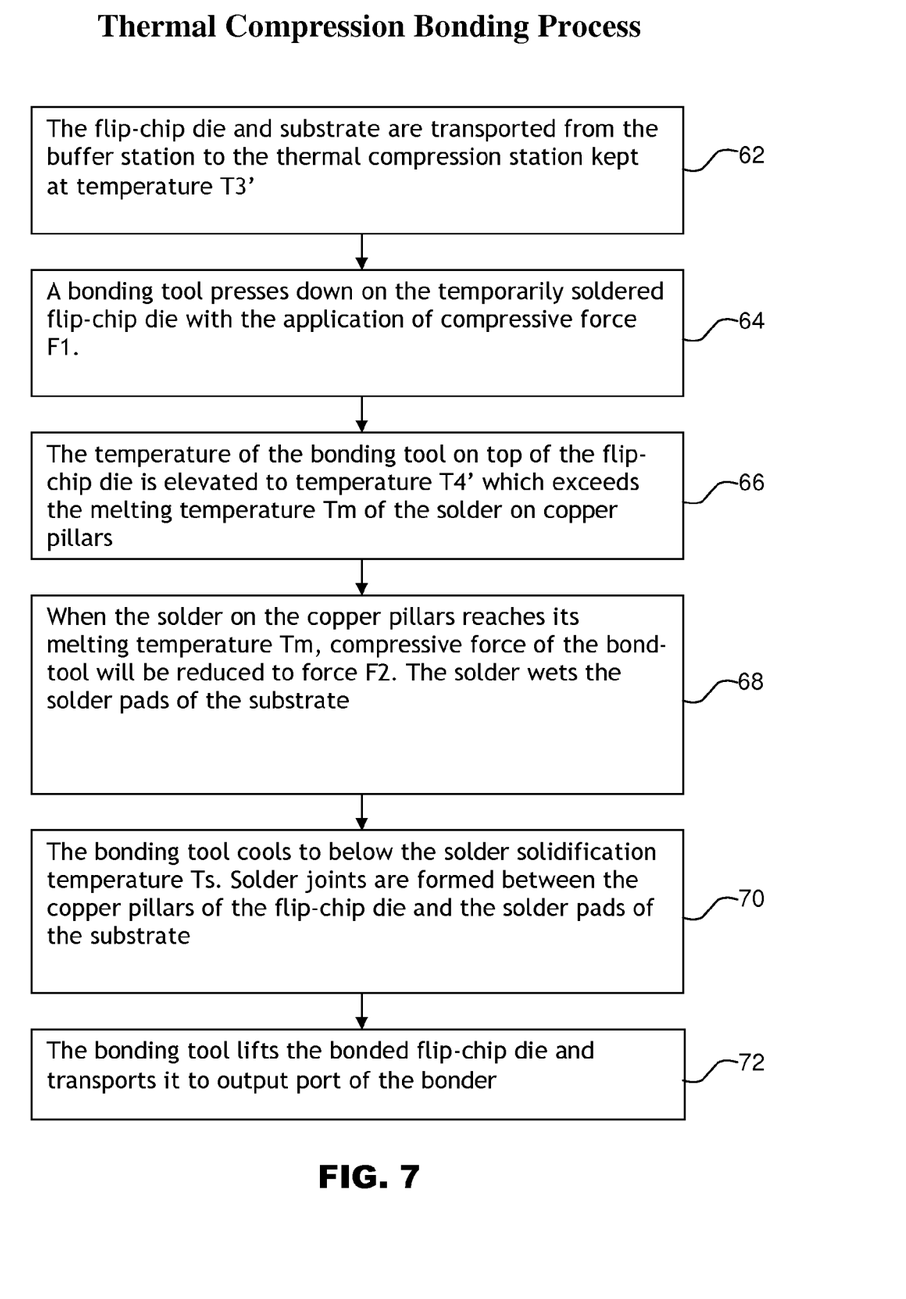
FIG. 7 illustrates a thermal compression process flow performed after the precision alignment process according to FIG. 5.

FIG. 7 illustrates a thermal compression process flow performed after the precision alignment process according to FIG. 5. The partially-bonded flip-chip die 10 is transferred from the pre-heat buffer station 36 to the thermal compression bonding station 38. At this stage, the temperature of the bonding platform in the thermal compression bonding station is at stand-by temperature T3', which is lower than the solder melting temperature Tm in a thermal compression pre-heat process 62. Without the need to conduct any further alignment for the partially bonded flip-chip die 10, a bonding tool at the thermal compression bonding station 38 is lowered and presses onto the flip-chip die 10 with compressive force F1 in a compressive force application process 64. The partially bonded flip-chip die 10 is held tightly by this thermal compression bonding tool. The temperature of the thermal compression bonding tool is then elevated to temperature T4' in a thermal compression heating process 66, which is higher than the melting temperature Tm of the solder on the copper pillars 12.

When the partially-bonded flip-chip die 10 held by the bonding tool is heated and reaches the solder melting temperature Tm, the solder caps 18 of the copper pillars 12 located outside the laser spots 45, 47 which have already melted will melt and wet the solder pads 16 of the substrate 14. Further, the solder joints at the corners of the flip-chip die 10 will re-melt and wet the corresponding solder pads 16. The compressive force of the bonding tool is reduced to force F2 from force F1 to prevent the collapsing of the melted solder caps in a thermal compression wetting process 68. Once all the solder caps 18 on the copper pillars 12 melt and wet the solder pads 16, the temperature of the thermal compression bonding tool is then reduced to below the solidification temperature Ts of the solder. When the temperature of the flip-chip die 10 drops below the solder solidification temperature Ts in a thermal compression cooling process 70, solder joints are formed between the copper pillars 12 of the flip-chip die 10 and the bond pads 16 of the substrate 14. The thermal compression bonding process is now completed. The fully bonded flip-chip die 10 is then lifted from the bonding platform by the bonding tool and transported to the output port 40 of the thermal compression bonder in an output transferring process 72. The whole thermal compression bonding cycle takes time t4' to complete.

In order to optimize the overall processing time and balance the throughput of the different process stations, namely the precision alignment station 32, pre-heat buffer station 36 and thermal compression bonding station 38, the sum of the process time t1' for the precision alignment process and process time t2' for laser soldering 34 should be approximately equal to t4'. The dwell time in the pre-heat buffer station 36 for pre-heating t3' should be less than the sum of processing times t1' and t2'. Hence, for throughput balancing, the processing times should be: t3'<(t1'+t2') and t1'+t2'≈t4'

The throughput (in terms of units per hour, or UPH) of the thermal compression bonder can be calculated from (1/t4')× 3600 and is dictated primarily by the thermal compression bonding process time t4'. This thermal compression bonding processing time t4' is still much shorter as compared to the conventional thermal compression bonding process with precision alignment and thermal compression being done sequentially and having overall processing time being equal to t1+t2.

In another embodiment of present invention, there may be a plurality of thermal compression bonding stations 38 for bonding multiple dies, and/or thermal compression bonding may be conducted by using a gang bonding tool for simultaneously holding multiple units at a same thermal compression bonding station 38 for heating. If n is the number of sites on the thermal compression bonding station 38 as well as number of units handled by the gang bonding tool. The processing times for a balanced process stations should be equivalent to:

$(n-1) \times (t1'+t2') + t3' < n \times (t1'+t2')$, and $n \times (t1'+t2') \approx t4'$ The throughput (UPH) of the thermal compression bonder with gang bonding tool handling n units is reduced to (n/t4')× 3600.

In other embodiments of the present invention, the construction of the solder layers for the copper pillars 12 of the flip-chip 10 and the solder pads 16 of the substrate 14 may consist of (i) solder caps only on copper pillars 12, (ii) solder only on solder pads 16, or (iii) solder on both copper pillars 12 and solder pads 16.

Furthermore, for some flip-chip package designs, no-flow underfill or non-conductive paste (NCP) are dispensed on the substrate 14 to cover the solder pads 16 prior to placing and bonding of the flip-chip die 10. The laser soldering process 34 can be conducted even in the presence of these thermal cure materials. However, appropriate compressive force is needed to squeeze out these materials from contacts of the bonding interfaces.

It should be appreciated that the bonding apparatus according to the preferred embodiment of the invention is capable of increasing the overall throughput of the thermal compression bonder for flip-chip bonding processes. Throughput can be increased by at least a factor of 2 since the precise alignment process and thermal compression process can be done in parallel.

The precise alignment station 32 stays at a relative low and constant pre-heat temperature of less than 100° C. and precise alignment process can be done at this platform with less influence from thermal expansion and deformation induced by heating and cooling of the bonding platform as experienced in the prior art.

The laser soldering process 34 for partial bonding is performed by firing two laser beams at two corners of the flip-chip die 10 right after the alignment process on the precision alignment station 32. The process time for this laser soldering process is about 500-800 ms (which is less than one second). Since only temporary solder joints are formed locally at the corners of the die 10, a relatively smaller power laser source is needed irrespective of the sizes of the flip-chip dies 10.

Moreover, since only two diagonally-opposite corners of the flip-chip die 10 are laser soldered, only two relatively low-cost laser sources are used for the laser soldering process and there is no need to use expensive high-powered laser and laser beam homogenizer optics in the setup. After partial bonding is performed by laser soldering 34, the flip-chip die 10 is adhered onto the substrate 14. The flip-chip die 10 is secured on the substrate 14 and can be transported to other process stations without inducing any displacement or dislocation.

A pre-heat buffer station 36 is introduced in between the precise alignment station 32 and the thermal compression bonding station 38. This pre-heat buffer station 36 heats up the flip-chip 10 on the substrate from their prior pre-heat temperature at 60-80° C. to 130-180° C. At this pre-heat temperature (130-180° C.), the thermal compression bonding station 38 needs only to elevate another ~100° C. to reach the soldering temperature for the soldering process to take place. This can help reduce the heating time for the thermal compression process.

Since the flip-chip die 10 is already secured onto the substrate 14, thermal compression bonding can be conducted for individual units or multiple units with the help of a gang press at the same thermal compression bonding station 38. The throughput can be further improved if the gang press is used for thermal compression bonding of multiple units.

The cooling requirement for the thermal compression bond head is much less demanding since it only has to cool down from the soldering temperature at about 240-260° C. to 200° C. (standby temperature of thermal compression bonding station 38) for the solidification of the solder joints at the end of the thermal compression bonding cycle. When the unit is cooled below 200° C., it can be transported to the output port of the bonder. The temperature operating range for this thermal compression station is from 200° C. to 260° C. This temperature operating range is much less than in the traditional setup which operates from below 150° C. and up to 260° C. Hence, the cycle times for heating and cooling can be shortened.

The invention described herein is susceptible to variations, modifications and/or additions other than those specifically described and it is to be understood that the invention includes all such variations, modifications and/or additions which fall within the spirit and scope of the above description.

The invention claimed is:

1. A thermal compression bonding method comprising the steps of:
   aligning electrical contacts on a die to bond pads on a substrate onto which the die is to be mounted;
   after aligning the die, holding the electrical contacts on the die against the bond pads on the substrate with a bonding tool;
   partially bonding the die to the substrate by providing heat to a local portion of the whole die to elevate a temperature at the portion of the die to above a melting point of solder comprised in the electrical contacts so as to melt at least some of the solder of the electrical contacts which are located at the said portion of the die;
   and thereafter heating the whole die to above the melting point of the solder of the electrical contacts so that the solder of the electrical contacts outside the said portion of the die are also melted to thermal compression bond the die to the substrate.

2. The thermal compression bonding method as claimed in claim 1, wherein the step of providing heat to the said portion of the die comprises the step of firing a laser beam onto the said portion of the die.

3. The thermal compression bonding method as claimed in claim 2, wherein the said portion of the die comprises two separate localized heating regions located at diagonally-opposite corners of the die.

4. The thermal compression bonding method as claimed in claim 2, wherein the laser beam produces a laser spot having a diameter of about 1 mm.

5. The thermal compression bonding method as claimed in claim 2, wherein the wavelength of the laser beam is in the range of 700-980 nm.

6. The thermal compression bonding method as claimed in claim 1, wherein during the step of aligning the electrical contacts on the die, the die is heated to a temperature which is substantially higher than room temperature but is less than 100° C.

7. The thermal compression bonding method as claimed in claim 1, further comprising the step of transferring the partially-bonded die and substrate to a buffer station which is heated to a pre-heat temperature that is higher than a temperature of the die when it is being aligned but less than a melting point of the solder, before subsequently heating the whole die to above the melting point of the solder at a thermal compression bonding station.

8. The thermal compression bonding method as claimed in claim 1, wherein during heating of the whole die to above the melting point of the solder, a temperature of a bonding tool holding the die is elevated to a temperature which is above the melting point of the solder, and the temperature of the bonding tool is then reduced to below a solidification temperature of the solder so as to form conductive joints between the die and the substrate.

9. The thermal compression bonding method as claimed in claim 1, wherein one die is being aligned at a first station while another die is being heated in parallel to above the melting point of the solder at a second station separate from the first station to melt the solder outside the said portion of the die.

10. The thermal compression bonding method as claimed in claim 1, wherein each electrical contact comprises a copper pillar topped with a solder cap.

11. The thermal compression bonding method as claimed in claim 1, wherein multiple dies are heated to above the melting point of the solder simultaneously at a plurality of thermal compression stations.

12. The thermal compression bonding method as claimed in claim 1, wherein multiple dies are held by a bonding tool and the multiple dies are simultaneously heated to above the melting point of the solder at a same thermal compression station.

13. A thermal compression apparatus comprising:
   a precision alignment station for aligning a die comprising electrical contacts to bond pads on a substrate onto which the die is to be mounted;
   a bonding tool for holding the electrical contacts on the die against the bond pads on the substrate;
   a heating device operative to partially bond the die to the substrate by providing heat to a local portion of the whole die to elevate a temperature at the portion of the die to above a melting point of solder comprised in the electrical contacts so as to melt at least some of the solder of the electrical contacts which are located at the said portion of the die;
   and a thermal compression station for heating the whole die to above the melting point of the solder of the electrical contacts so that the solder of the electrical contacts outside the said portion of the die are also melted to bond the die to the substrate.

14. The thermal compression apparatus as claimed in claim 13, further comprising a pre-heat buffer station that is operative to heat the partially-bonded die to a pre-heat temperature that is higher than a temperature to which the die is heated at the precision alignment station but less than the melting point of the solder.

15. The thermal compression apparatus as claimed in claim 13, wherein the heating device comprises at least one laser device that is operative to fire a laser beam to provide heat to the said portion of the die.

16. The thermal compression apparatus as claimed in claim 15, wherein the heating device comprises two laser devices that are operative to fire separate laser beams at two separate localized heating regions located at diagonally-opposite corners of the die.

17. The thermal compression apparatus as claimed in claim 14, wherein the laser beam produces a laser spot having a diameter of about 1 mm.

18. The thermal compression apparatus as claimed in claim 14, wherein the wavelength of the laser beam is in the range of 700-980 nm.

19. The thermal compression apparatus as claimed in claim 13, wherein processing at the precision alignment station and thermal compression station are conducted simultaneously in parallel on different dies.

20. The thermal compression apparatus as claimed in claim 19, wherein the thermal compression station further comprises a plurality of separate stations where multiple dies are simultaneously heated to above the melting point of the solder at the stations.

* * * * *